United States Patent [19]

Hata et al.

[11] Patent Number: 4,583,040
[45] Date of Patent: Apr. 15, 1986

[54] TESTING APPARATUS FOR ELECTRICAL CHARACTERISTICS OF SHEET-LIKE INSULATING MATERIALS

[75] Inventors: Ryosuke Hata; Masayuki Hirose; Takeshi Nagai; Kunitomo Kato; Kenjiro Osaki, all of Osaka, Japan

[73] Assignee: Sumitomo Electric Industries, Ltd., Osaka, Japan

[21] Appl. No.: 594,625

[22] Filed: Mar. 22, 1984

[30] Foreign Application Priority Data

Mar. 22, 1983 [JP] Japan ............................. 58-41834[U]

[51] Int. Cl.⁴ ............................................. G01R 31/12
[52] U.S. Cl. .......................................... 324/54; 73/159
[58] Field of Search ................ 340/675, 677; 73/159, 73/160; 324/54, 51; 242/75.52

[56] References Cited

U.S. PATENT DOCUMENTS 3,321,703  5/1967  Tyszewicz ............................. 324/54

FOREIGN PATENT DOCUMENTS 0583391  12/1977  U.S.S.R. ............................... 73/160

Primary Examiner—Reinhard J. Eisenzopf
Assistant Examiner—Jose M. Solis
Attorney, Agent, or Firm—Sughrue, Mion, Zinn, MacPeak and Seas

[57] ABSTRACT

A testing chamber for electrically testing a sample of insulating material or materials in sheet form, under controllable conditions of pressure and temperature. The pressure resistant chamber is air and liquid tight to permit testing of oil impregnated samples unexposed to harmful air. A frame is positioned within the chamber. A supply reel storing a test sample of insulating material or materials and a takeup reel for receiving the test sample drawn from the supply reel are both rotatably mounted on the frame. The supply and takeup reels are separated from each other to form a testing station therebetween. A shaft with a handle is attached to the takeup reel and extends out of the chamber to facilitate rotation of the takeup reel whereby the test sample may be removed from the supply reel to the testing station and then to the takeup reel. First and second electrodes are connected, respectively, to the high and low voltage terminals of a power supply. Position and pressure producing means are operatively connected to at least one of the electrodes to control the spacing between the electrodes and the pressure applied to the test sample by the electrodes.

17 Claims, 2 Drawing Figures

TESTING APPARATUS FOR ELECTRICAL CHARACTERISTICS OF SHEET-LIKE INSULATING MATERIALS

BACKGROUND OF THE INVENTION

This invention relates to a testing apparatus for testing the electrical characteristics of oil-impregnated or gas filled insulating materials.

Conventional oil-impregnated or gas filled insulating materials in sheet form have heretofore been subjected to electrical characteristic testing by the following method. Insulating materials are laid on a lower electrode connected to the low voltage side of a power supply and an upper electrode connected to the high voltage side of the power supply is put on the top surface of the insulating materials. The insulating material and both electrodes are disposed in oil exposed to the atmosphere.

A conventional testing apparatus of this class is disadvantageous in that the characteristics of the oil change when it is exposed to the air, thereby influencing the test data. Since the longer the oil is exposed to air, the greater is the likelihood it will undergo changes in its characteristics, tests carried out over hours are more likely to be adversely affected.

More specifically, the oil bath in the prior art is open to the air and therefore cannot be subjected to testing under oil pressure. Since in the prior art only a single sample is tested at a time, and samples must be replaced after each test, the sample is exposed to harmful air when it is exchanged with a new one, and that confusion occurs among exchanged samples.

SUMMARY OF THE INVENTION

This invention eliminates the problems encountered with the conventional testing apparatus. According to the teachings of the invention, there is provided a testing apparatus for testing the electrical characteristics of one or more insulating materials in sheet form, the testing apparatus including a pressure resistant, airtight container, in which testing of electrical characteristics of the samples is achieved regardless of the variations of pressure and temperature of insulating oil.

The testing apparatus of the invention also includes a supply reel and a takeup reel arranged to keep the test samples of sheets of insulating materials at a suitable distance from one another in the pressure withstanding, airtight container. The container is provided with a removable cover, a handle for rotating the takeup reel from outside the container and lower and higher voltage electrodes for applying an electrical potential across a test sample. The low voltage electrode in the container abuts against one surface of a test sample of insulating material or materials extended between the two reels. The high-voltage electrode in the container abuts against the opposing surface of the test sample under biasing force of a spring or the like, the container being provided at a portion thereof with means for separating at least one of the electrodes from the test sample, if necessary. In particular, according to the invention, the testing apparatus is fabricated so that the test sample of a sheet of insulating material that is put in a supply reel could be subjected to a drying and an oil-impregnating treatment out of the container. The test sample that is placed on the supply reel out of the container can be stored in the container where, without being exposed to the air, it can undergo electrical testing. The electrical testing may be carried out a plurality of times after only a single loading of the test sample. In addition, the pressure under which the two electrodes pressure abut against one another with a test sample therebetween may be kept constant by the spring.

BRIEF DESCRIPTION OF THE DRAWINGS

A testing apparatus embodying the invention will be described hereinafter in conjunction with the accompanying drawings in which.

DETAILED DESCRIPTION OF THE PREFERRED EMBODIMENT

Numeral 1 is a container which serves as a test chamber. It includes a cylindrical peripheral wall 2, with one end thereof being fully closed by an end wall 3. The other end of the wall 2 is initially open.

Figure 2:
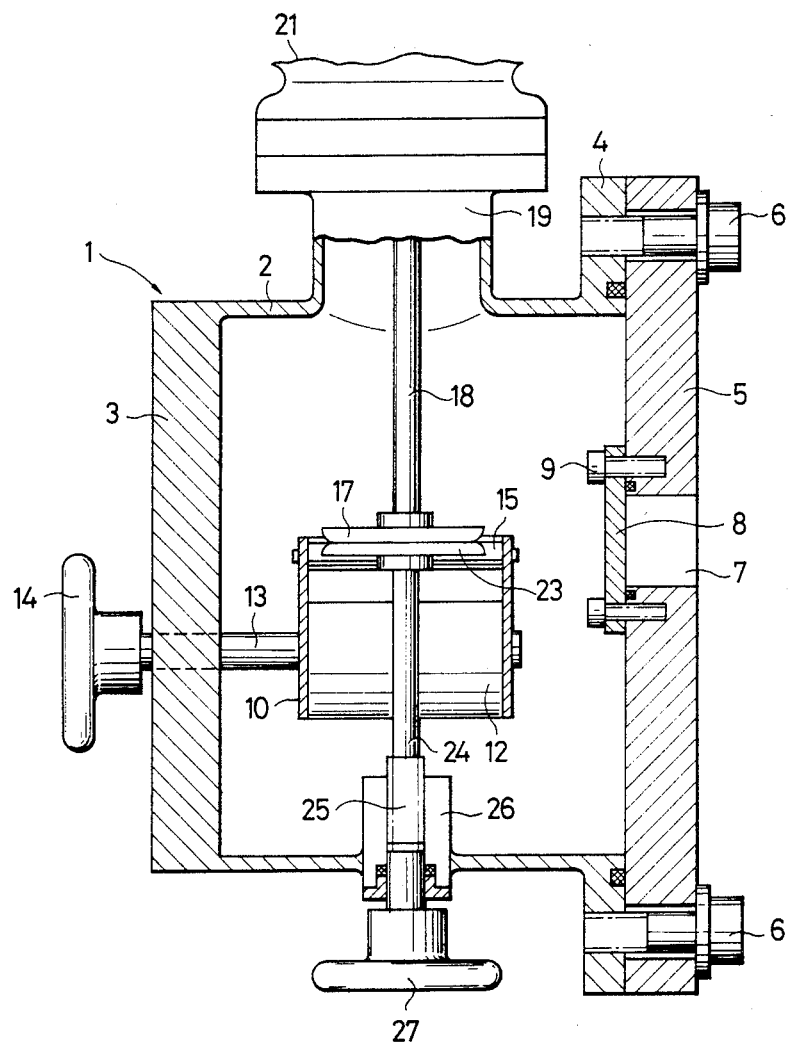
FIG. 2 is a longitudinal section of the embodiment of the invention shown in FIG. 1.

A flange 4 is integrally formed with the open end of the peripheral wall 2 as illustrated in FIG. 2. A cover 5 is provided to mount on flange 4. It is formed with a plurality of insert openings through which bolts 6 pass, the latter being screwed into a plurality of threaded holes in the flange 4 to thereby be held in position.

The cover 5 is also provided with a peep or inspection window 7 which is closed by a pressure resistant transparent plate 8. The transpatent plate is secured by a plurality of bolts 9 to the cover 5. Packings or gaskets are disposed between the cover 5 and the flange 4 and between the cover 5 and the transparent plate 8, respectively, to maintain air-tightness and liquid-tightness.

A frame 10 is held in position in the container 1 and carries a supply reel 11 and a takeup reel 12, removably and rotatably mounted on the frame 10 at a suitable distance from one another. A shaft 13, one end thereof being mounted to the takeup reel 12, passes through the end wall 3. The other end of shaft 13 connects to a handle 14 for rotating the reel 12 from outside the chamber. Packing is attached to the portion of the end wall 3 through which the shaft 13 passes, thereby maintaining airtightness and liquid-tightness.

A pair of guide rollers 15 are mounted upwardly and interiorly of the frame 10. A test sample 16 of one or more sheet-like insulating materials are wound around the supply reel 11, passes over the guide rollers 15 and is taken up by the takeup reel 12.

The test sample 16 of insulating material or materials stored on the supply reel 11 is subjected to a drying and oil-impregnating treatment before being introduced into the container 1. In the container it is stored on the supply reel 11, without being exposed to air, from where it can undergo electrical testing. Further, the electrical testing is carried out a plurality of times after only one loading of the sample on the definite condition of pressure and temperature of the insulating oil.

Numeral 17 is a high-tension or high voltage electrode which is fixed to the lower end of a conductive rod 18. The upper end of the conductive rod 18 passes through the interior of a cylinder 19 upwardly of the peripheral wall 2 and is embedded in an insulator 20, such as epoxy resin or the like, rigidly mounted on the top of the cylinder 19.

Numeral 21 is a second insulator which encircles the outside of the insulator 20. The upper end of the conductive rod 18 is firmly attached to a conductor 22 secured to the top of the second insulator. The conductor 22 is connected to the high voltage side of the power source (not shown). The insulator 20 is used to isolate the insulator 21 from the pressure of oil in the chamber 1.

Numeral 23 is a low voltage electrode which is rotatably mounted on the top of a conductive rod 24 whose lower end is provided with an external thread 25 that is threaded into an external thread in a tubular member 26 downwardly of the container 1. A handle 27 is secured to the lower end of the conductive rod 24 projecting from the lower end of the tubular member 26. With this structure, the electrical characteristics testing is achieved at the portion of the test sample 16 confronting the electrodes 17, 23. For the continuous testings, the sample 16 is driven by the rotation of the takeup reel 12 upon rotation of the handle 14 to take up the sample portion whose length corresponds to the length of the electrodes. As a result, a next portion of the test sample to be subsequently tested is brought into confrontation with the electrodes 17, 23. Accordingly, upon one assembly of the sample into the testing apparatus, a number of testings can be achieved.

Packing is fixed to a portion of the tubular member 26 through which the conductive rod 24 passes, thereby maintaining the air-tightness and liquid-tightness of the container.

The conductive rod 24 is connected by suitable means to the low voltage side of the power source.

Figure 1:
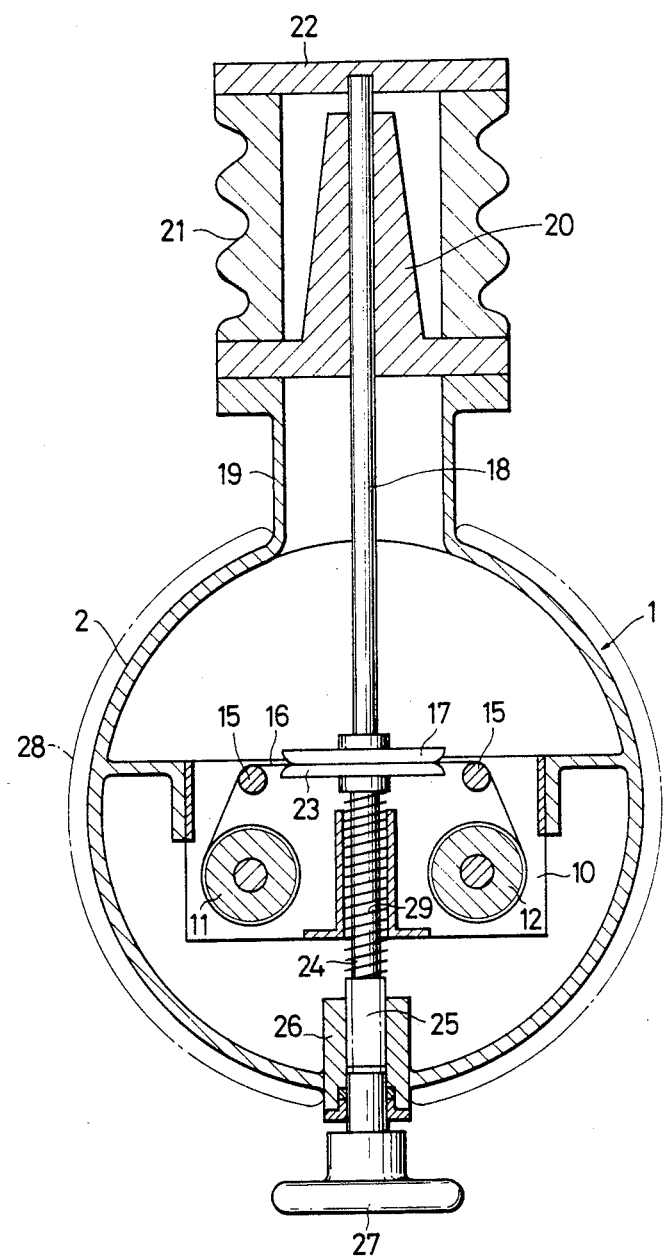
FIG. 1 is a cross sectional view showing one embodiment of a testing apparatus of the invention.

The peripheral wall 2 may be circumferentially encircled and heated by a heater 28 as shown by the dot-and-dash lines of FIG. 1 to control the temperature of the insulation oil. Further, the testing is made under various pressure by forming an oil pressure port at a desired portion of the container to fill pressurized insulating oil therein. As a result, testing is performed under various pressure and temperature of the insulating oil.

Numeral 29, is a spring serving to obtain constant pressure under which the two electrodes 17, 23 pressure abut against one another.

The test sample 16 of one or more sheet-like insulating materials extend between the pair of reels 11, 12 and between the guide rollers 15 and then are held between upper and lower electrodes 17, 23 so that its electrical characteristics is tested by application of high voltage thereto. The distance between the electrodes 17 and 23 may be freely increased by the handle 27 on one hand, and the test sample 16 may be freely moved by causing the handle 14 to rotate the take-up reel 12 on the other hand, so that the test sample 16 may be continuously subjected to testing by opening and closing the electrodes 17, 23 and by movement of the test sample 16.

The container 1 is of a closed type to prevent oil from being exposed to the air, thereby minimizing the possibility of deteriorating its performance. For example, the pressure in the container is freely adjusted from 0 kg/cm² abs to 30 kg/cm² abs whereas the pressure under which the test sample is held between the electrodes 17 and 23 may also be adjusted by the handle 27 from 0 kg/cm² abs to 5 kg/cm² abs. For this reason, the test sample may be tested under various oil pressure conditions and may be also heated by a heater to change the temperature under which testing occurs.

A gas other than the oil is confined in the container to carry out testing in the gaseous environment. When the reels and the test samples are not used, the oil and gas themselves may be tested.

The electrodes, if each are provided with a guard, dielectric properties of insulating materials are tested. The test is applicable to a single and a plurality of the sheets in the form of stack having, for example, ten sheets. The sheet formed with a perforation is also employable. In this case, it is optional to determine the perforation having a diameter of 1-20 mm. All electrical characteristics tests such as AC, impulse, DC, switching surge breakdown tests, corona, and tan δ, ϵ, ρ, and so on can be conducted in accordance with the present invention. The sample may be inspected as the container or the cover is provided with a peep or an inspection window.

What is claimed is:

1. A testing apparatus for testing the electrical characteristics of one or more sheet-like insulating materials comprising: a pressure resistant, air-tight container having a removable cover; a supply reel and a takeup reel arranged in said container for maintaining material bobbins at a suitable distance from one another in said container; a handle extending externally from the container for rotating the takeup reel from outside the container; a low voltage electrode located in the container for abutting against one surface of a test sample of the sheet-like insulating materials extended between said two reels; and a high voltage electrode located in the container for abutting against the opposing surface of the test sample; the container being provided at a portion thereof with means for separating at least one of the electrodes from the test sample of sheet-like insulating materials.

2. A testing apparatus for testing the electrical characteristics of one or more sheet-like insulating materials as claimed in claim 1 wherein, the test sample of sheet-like insulating materials is put in a supply reel, said test sample being subject to drying and oil-impregnation treatments out of said container, and said test sample thus treated being positioned into said container without being exposed to air to undergo electrical testing in said container.

3. A testing apparatus for testing the electrical characteristics of one or more sheet-like insulating materials as claimed in claim 1, further comprising a heating means disposed over said container to control temperature of insulation oil or gas filled in said container.

4. A testing apparatus for testing the electrical characteristics of one or more sheet-like insulating materials as claimed in claim 1, wherein said container is formed with an opening to introduce pressurized insulation oil or gas into said container to control internal pressure of said oil or gas.

5. A testing apparatus for electrical characteristics of one or more sheet-like insulating materials as claimed in claim 1, further including a spring for maintaining the pressure under which the two electrodes pressure abut against one another constant.

6. A testing chamber for electrically testing a sample of insulating material comprising: a peripheral wall, an end wall fully closing one end of the peripheral wall, a removable cover fully closing the end of said peripheral wall opposite said end wall, a frame positioned within said chamber defined by said peripheral wall, said end wall and said cover, a supply reel for storing the test sample and a takeup reel for receiving the test sample from the supply reel, each reel rotatably mounted on said frame and spaced from each other, a low voltage electrode and a high voltage electrode opposing each other and located in the space between said supply and takeup reels for connection to a power supply.

7. A testing chamber as claimed in claim 6, further including first means coupled to at least one of said electrodes for controlling the separation and pressure between the first and second electrodes.

8. A testing chamber as claimed in claim 7, wherein said test sample passes between said first and second electrodes, and further including second means coupled to at least one of said electrodes for causing said electrodes to abut opposite sides of a test sample under a constant pressure.

9. A testing chamber as claimed in claim 8, wherein said first means includes a shaft, a handle, and a threaded opening in said peripheral wall, said shaft having one end connected to said first electrode, and its other end threaded for threading through said threaded opening in said peripheral wall and adapted for connection to said handle.

10. A testing chamber as claimed in claim 9, wherein said second means includes a spring to provide a fixed pressure between said two electrodes.

11. A testing chamber as claimed in claim 10, further including a rod, a contact, at least a portion of which is external to said chamber, and at least one insulator, said rod being attached at one end thereof to said second electrode and at its other end to said contact, said rod extending through said insulator and out of electrical contact with said chamber walls.

12. A testing chamber as claimed in claim 8, wherein said chamber is filled with a gaseous medium.

13. A testing chamber as claimed in claim 8, wherein said chamber is filled with oil.

14. A testing chamber as claimed in claim 8, wherein said chamber is constructed to withstand pressure therewithin between 0 kg/cm$^2$ abs and 30 kg/cm$^2$ abs.

15. A testing chamber as claimed in claim 8, wherein said first and second means varies the pressure between said first and second electrodes between 0 kg/cm$^2$ and 5 kg/cm$^2$ abs.

16. A testing chamber as claimed in claim 6, further including guide rollers for guiding said test sample between said supply and takeup reels, a takeup reel shaft, and a takeup reel handle located external to said chamber, one end of said takeup reel shaft being connected to said takeup reel, its other end passing through a wall of said chamber for connection to said takeup reel handle.

17. A testing chamber as claimed in claim 16, further including a transparent inspection window attached to said cover.

* * * * *